(12) United States Patent
Lin et al.

(10) Patent No.: US 12,349,551 B2
(45) Date of Patent: Jul. 1, 2025

(54) ORGANIC LIGHT EMITTING DIODE DISPLAY STRUCTURES AND METHODS OF FORMING

(71) Applicant: Applied Materials, Inc., Santa Clara, CA (US)

(72) Inventors: Yu Hsin Lin, Zhubei (TW); Si Kyoung Kim, Gwangju-si (KR); Jungmin Lee, Santa Clara, CA (US); Dieter Haas, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 489 days.

(21) Appl. No.: 17/754,233

(22) PCT Filed: Sep. 14, 2020

(86) PCT No.: PCT/US2020/050645
§ 371 (c)(1),
(2) Date: Mar. 28, 2022

(87) PCT Pub. No.: WO2021/071630
PCT Pub. Date: Apr. 15, 2021

(65) Prior Publication Data
US 2022/0376204 A1 Nov. 24, 2022

Related U.S. Application Data

(60) Provisional application No. 62/913,478, filed on Oct. 10, 2019.

(51) Int. Cl.
*H10K 59/122* (2023.01)
*H10K 50/828* (2023.01)
(Continued)

(52) U.S. Cl.
CPC ......... *H10K 59/122* (2023.02); *H10K 50/828* (2023.02); *H10K 50/844* (2023.02);
(Continued)

(58) Field of Classification Search
CPC .. H10K 59/122; H10K 50/828; H10K 50/844; H10K 71/00; H10K 59/12;
(Continued)

(56) References Cited

U.S. PATENT DOCUMENTS

| 5,873,760 A | 2/1999 | Wei et al. |
| 9,653,525 B2 * | 5/2017 | Park ..................... H10K 59/878 |

(Continued)

FOREIGN PATENT DOCUMENTS

| CN | 1347266 A | 5/2002 |
| CN | 108417609 A | 8/2018 |

(Continued)

OTHER PUBLICATIONS

Hao Lei et al., Low Damage Sputter Deposition of ITO Films on Organic Light Emitting Films, Transaction of the Materials Research Society of Japan, 2009 34[2] 321-324.

(Continued)

*Primary Examiner* — Caleb E Henry
(74) *Attorney, Agent, or Firm* — Patterson + Sheridan, LLP (57) ABSTRACT

Methods and apparatus for forming organic light emitting diode (OLED) structures disposed on a substrate are provided. In one embodiment, a method for forming an organic light emitting diode (OLED) substrate is provided that includes forming a first conductive layer on a substrate in a first direction, forming a dielectric layer on a portion of the first conductive layer, wherein the dielectric layer includes a well having a portion of the first conductive layer exposed, depositing an organic material into the well and on the (Continued)

dielectric layer continuously in the second direction and between the two bus bars, and forming a second conductive layer on the organic material continuously in a second direction orthogonal to the first direction and between two bus bars, wherein the second conductive layer is in direct contact with the bus bars on opposing sides thereof; and depositing an encapsulating layer on the second conductive layer continuously in the second direction and fully cover the second conductive layer.

19 Claims, 5 Drawing Sheets

(51) Int. Cl.
| H10K 50/844 | (2023.01) |
| H10K 59/12 | (2023.01) |
| H10K 59/131 | (2023.01) |
| H10K 59/80 | (2023.01) |
| H10K 71/00 | (2023.01) |

(52) U.S. Cl.
CPC ..... *H10K 59/131* (2023.02); *H10K 59/80522* (2023.02); *H10K 59/873* (2023.02); *H10K 71/00* (2023.02); *H10K 59/12* (2023.02); *H10K 59/1201* (2023.02)

(58) Field of Classification Search
CPC ............. H10K 59/1201; H10K 59/131; H10K 59/80522; H10K 59/873; H10K 59/35; H10K 71/166
See application file for complete search history.

(56) References Cited

U.S. PATENT DOCUMENTS

| 10,192,947 B2* | 1/2019 | Kim ...................... H10K 59/871 |
| 10,483,499 B2* | 11/2019 | Wang .................... H10K 71/00 |
| 2004/0253756 A1 | 12/2004 | Cok et al. |
| 2015/0001485 A1 | 1/2015 | Kang |
| 2016/0181332 A1* | 6/2016 | Park ..................... H10K 50/856 |
| | | 257/88 |
| 2017/0125723 A1* | 5/2017 | Moon .................... H10K 71/00 |
| 2017/0194605 A1* | 7/2017 | Kuji ....................... H10K 77/10 |
| 2019/0006427 A1* | 1/2019 | Lu .......................... H10K 59/00 |
| 2019/0067390 A1* | 2/2019 | Gao ...................... H10K 59/1315 |
| 2019/0288044 A1* | 9/2019 | Hou ..................... H10K 59/1201 |
| 2020/0203446 A1* | 6/2020 | Luo ..................... H10K 59/1315 |
| 2022/0052132 A1* | 2/2022 | Wan ....................... H10K 50/15 |

FOREIGN PATENT DOCUMENTS

| EP | 1191593 B1 | 7/2007 |
| JP | 2017162832 A | 9/2017 |
| KR | 20070025152 A | 3/2007 |

OTHER PUBLICATIONS

Korean Office Action issued to Patent Application No. 10-2022-7015037 on Jan. 17, 2024.
International Search Report / Written Opinion issued to PCT/US2020/05645 issued on Feb. 17, 2021.
Korean Office Action issued to patent application No. 10-2022-7015037 on Sep. 26, 2024.
China Office Action issued to patent application No. 202080076342.5 on Apr. 8, 2025.

* cited by examiner

2
ORGANIC LIGHT EMITTING DIODE DISPLAY STRUCTURES AND METHODS OF FORMING

BACKGROUND

Field

Embodiments of the disclosure generally relate to methods and apparatus for forming organic light emitting diode (OLED) display structures, and more specifically, to forming OLED display structures using line-type lithography patterning.

Description of the Related Art

Displays using organic light emitting diodes (OLEDs) have gained significant interest recently in display applications due to their faster response time, larger viewing angles, higher contrast, lighter weight, low power and amenability to being formed on flexible substrates, as compared to liquid crystal displays (LCDs). However, conventionally, multiple fine metal mask processes are required to form the red, green and blue subpixels, which limits pixel density and is very difficult for large sized display. Photolithography patterning was proposed to overcome limitations from fine metal mask processes. In conventional photolithography patterning, "dot" type patterning with full OLED stack deposition & pixelated encapsulation is used to form red, green and blue subpixels, and additional cathode contact process steps are required to provide the electrical communication pathways between a common bus line and the cathode for each subpixel. For example, in conventional "dot" type patterning, portions of individual subpixels are masked so that the cathode of each subpixel is isolated from other subpixel cathodes, and an additional cathode contact process is required to connect the cathodes to the common bus line.

Therefore, improved methods and apparatus for forming OLED display structures is needed.

SUMMARY

Methods and apparatus for forming organic light emitting display structures disposed on a substrate are provided. In one embodiment, a method for forming an organic light emitting diode (OLED) display structure is described that includes depositing two bus bars on a substrate in a first direction. The method includes depositing a first conductive layer on the substrate as a plurality of discrete islands in a second direction relative to the first direction, depositing a dielectric layer on a portion of the first conductive layer, wherein the dielectric layer includes a well having a portion of the first conductive layer exposed. The method includes depositing an organic material into the well and on the dielectric layer continuously in the second direction and between the two bus bars, and depositing a second conductive layer on the organic material continuously in the second direction and between the two bus bars, wherein the second conductive layer is in direct contact with each of the bus bars on opposing sides thereof. The method includes depositing an encapsulating layer on the second conductive layer continuously in the second direction and fully cover the boundary of second conductive layer.

In another embodiment, an organic light emitting diode substrate is disclosed that includes a first conductive layer formed on a substrate in a first direction, a dielectric layer provided on a portion of the first conductive layer, wherein the dielectric layer includes a well. The organic light emitting diode substrate further includes an organic material in the well and on the dielectric layer continuously a second direction orthogonal to the first direction and between the two bus bars and in contact with the first conductive layer, a second conductive layer provided on the organic material continuously in the second direction between two bus bars, wherein the second conductive layer is in direct contact with the bus bars on opposing sides thereof, and an encapsulating layer on the second conductive layer continuously in the second direction to fully cover the second conductive layer.

In another embodiment, an organic light emitting diode substrate is disclosed that includes an anode layer formed on a substrate in a first direction, a dielectric layer provided on a portion of the anode layer, wherein the dielectric layer includes a well with portion of anode layer exposed. The organic light emitting diode substrate further includes an organic material in the well and in contact with the anode layer and on the dielectric layer continuously in the second direction. The organic light emitting diode substrate further includes a cathode layer provided on the organic material and provided as a continuous layer in a second direction orthogonal to the first direction and between two bus bars, wherein the cathode is in direct contact with the bus bars at a cathode/bus bar interface on opposing sides thereof, and an encapsulating layer provided on the cathode layer continuously in the second direction to fully cover the second conductive layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 1A-1C are various views of a portion of a display according to embodiments disclosed herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure provides methods and apparatus for forming organic light emitting display structures on a substrate.

Figure 1A:
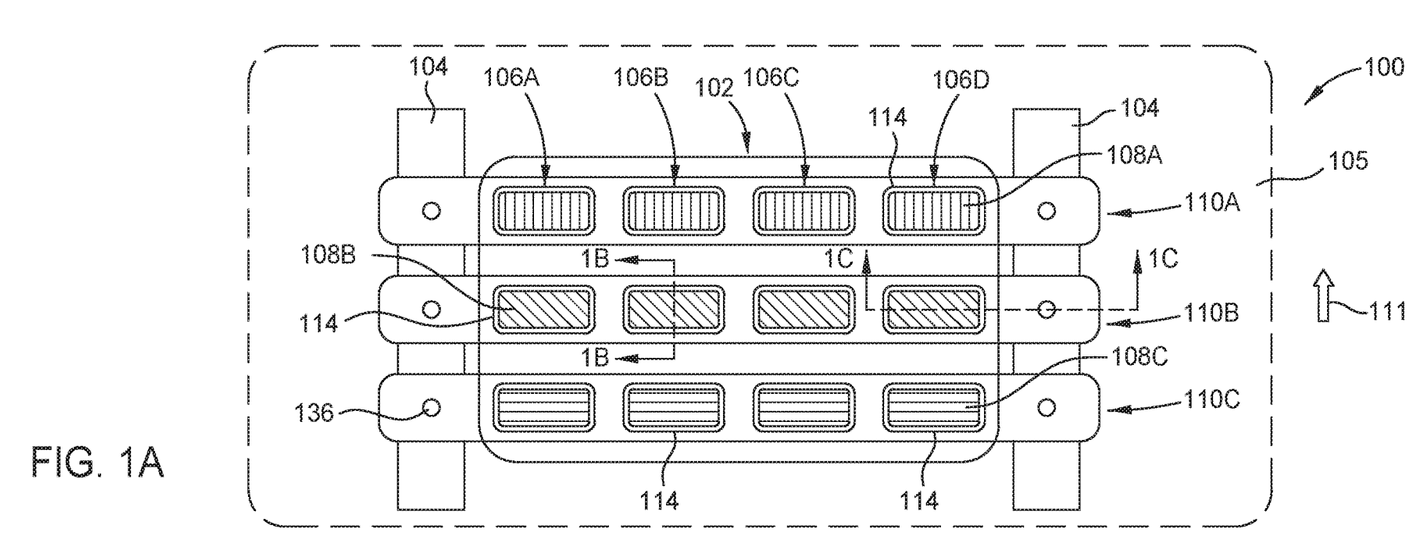
FIG. 1A is a plan view of a pixel sub-area of the display.
Figure 1B:
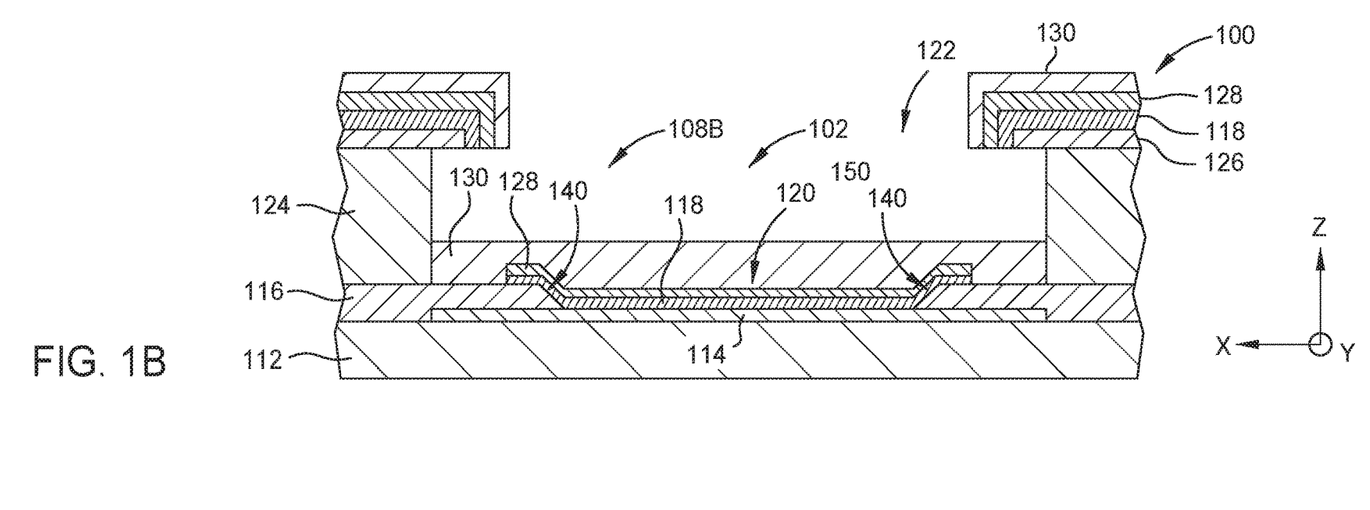
FIGS. 1B and 1C are sectional views of a portion of the display along lines 1B-1B of FIG. 1A and lines 1C-1C of FIG. 1A, respectively.
Figure 1C:
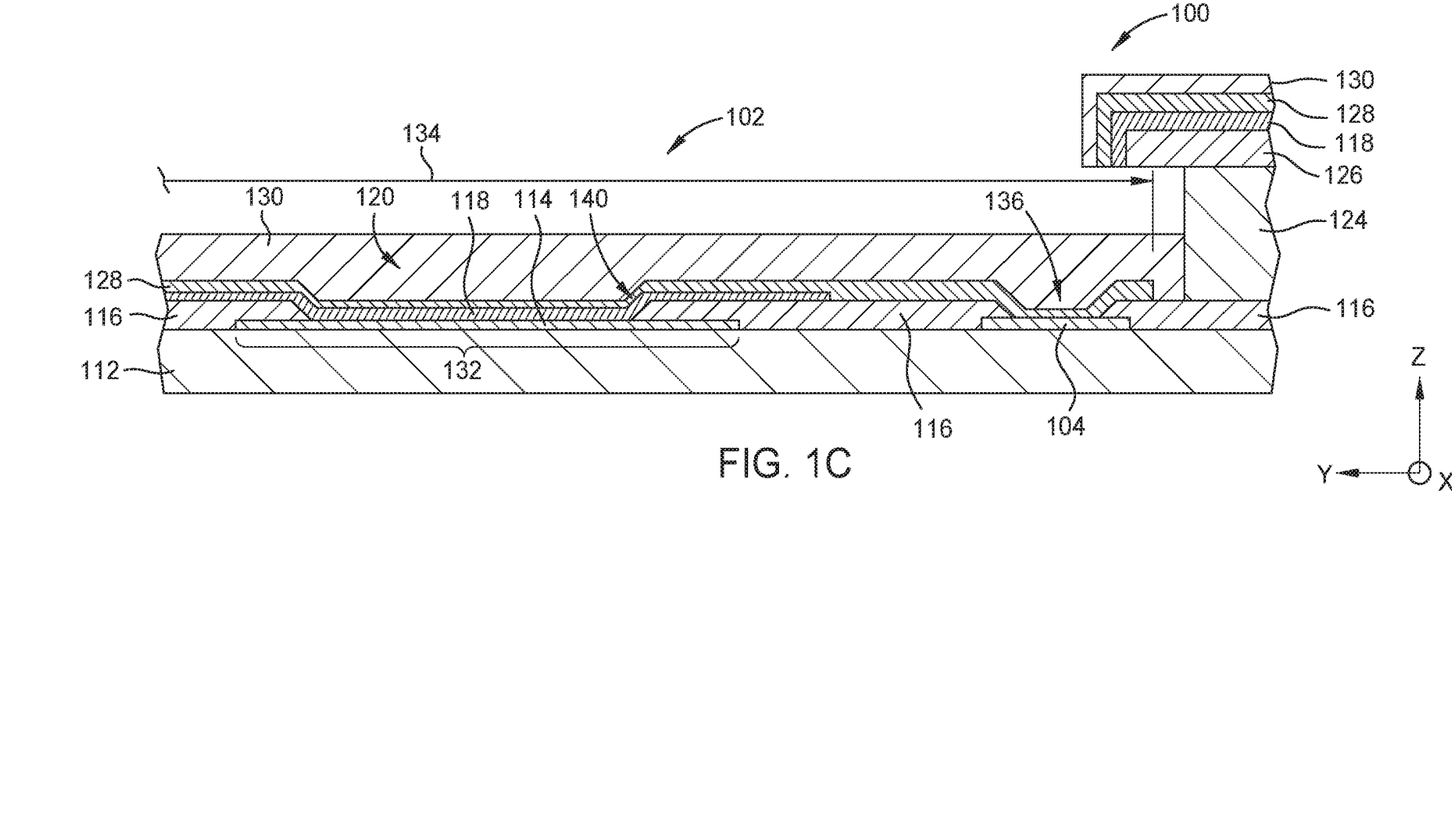

FIGS. 1A-1C are various views of a display 100 according to embodiments disclosed herein. FIG. 1A is a plan view of an active area 102 of the display 100, and FIGS. 1B and 1C are sectional views of a portion of the active area 102 along lines 1B-1B of FIG. 1A and lines 1C-1C of FIG. 1A, respectively.

The display 100 includes the active area 102 located between two bus bars 104 in a peripheral area 105 (e.g., a non-active area) extending in a first direction and on opposing sides (or ends) thereof as shown in FIG. 1A. The active area 102 of the display 100 includes a plurality of pixel columns 106A-106D extending in the first direction, each including a plurality of sub-pixels shown as sub-pixel 108A (e.g., red), sub-pixel 108B (e.g., green) and sub-pixel 108C (e.g., blue). While not shown, a plurality of pixels, such as the pixel columns 106A-106D having the sub-pixels 108A-108C, repeat across the display 100. For example, if the resolution is of the display 100 is 1920×1080 then there will be 1920 sub-pixels 108A, 1920 sub-pixels 108B and 1920 sub-pixels 108C in each of 1080 pixel columns.

The colors of each of the one or more sub-pixels of the plurality of pixel columns 106A-106D extend if rows 110A-C in a second direction that is generally orthogonal to the first direction. Generally orthogonal may be defined as greater than 45 degrees up to and including 90 degrees. For example, here sub-pixels in columns 106A-106D extend in the same row (rows 110A-110C), and an organic material for the all of the sub-pixels in the same row in at least a single active area is deposited into individual wells for the sub-pixels of the row simultaneously using thermal vaporized OLED materials.

In one specific example, all of the sub-pixels 108A in row 110A are formed by depositing the organic material through a slotted photolithography pattern having a linear slot extending in the second direction of the row 110A while the same photolithography pattern covers the sub-pixels regions of rows 110B and 110C preventing the organic material being deposited from reaching the locations thereof. This photolithography pattern also extends to overlap bus bars. A mask with opening larger than whole active area 102 is used to prevent organic light emitting layer deposition in direct contact to bus bars but mask is not used for second conductive layer or a different mask is used for second conductive layer which allows second conductive layer in direct contact with bus bars. This type of mask is sometimes referred to as an "open mask", as the mask does not singulate the delivery of the organic material to only the individual sub-pixel locations, but also in the regions between the individual sub-pixel locations. Likewise, all of the sub-pixels 108B in row 110B are deposited using another slotted photolithography mask pattern having the slot extending in the second direction of the row 110B while the same photolithography pattern covers the rows 110A and 110C. In the same manner, all of the sub-pixels 108C in row 110C are deposited using another slotted photolithography mask pattern having slots along a direction of the row 110C while the same photolithography pattern covers the rows 110A and 110B. A scan direction 111 (the first direction (Y direction relative to the display 100)) of the OLED source material is generally parallel to the first direction in which the rows 110A-110C extend. Sub-pixels located in other active areas of the display 100 are deposited similarly to the active area 102 shown and described in FIG. 1A. During deposition (scanning), the open mask is stationary to the substrate 112 and the OLED material source scans over substrate 112.

This method of manufacture differs from conventional photolithography OLED patterning methods using "dot-type" photolithography pattern having a fine opening for each of the sub-pixels. Using a slotted photolithography pattern for each of the deposition steps as disclosed herein doesn't require additional cathode contact processes as cathodes of each sub-pixel is "connected" together and in direct contact to bus bars. Other attributes of the active area 102 as described herein by the slotted photolithography pattern will be described below.

As shown in FIGS. 1B and 1C, the sub-pixel 108B is shown in cross-section. The location for the formation of the sub-pixel 108B is located on a substrate 112. A plurality of anodes 114 (a first conductive layer) is formed on the substrate 112. Each anode 114 is associated with a discrete sub-pixel, such as each of the sub-pixels 108A-108C. The anodes 114 are formed as discrete conductive islands that each are overlapping or within the associated sub-pixel. Each of the anodes 114 are also electrically connected to a thin film transistor (not shown) on the substrate 112, which provides electrical current to each OLED device. The anodes 114 may be transparent or reflective depending on whether the display 100 will be utilized as a bottom emission display or a top emission display.

A pixel definition layer 116 (a dielectric layer) is formed on the anode 114, and includes a plurality of wells 120 formed to extend therethrough, the pixel definition layer 116 providing the boundaries of the wells 120. In the sectional view of FIG. 1B, a portion of the pixel definition layer 116 defines the boundaries or opposed sides of the well 120 spaced from one another in the first direction and is occupied by OLED material 118. The pixel definition layer 116 is a dielectric material such as silicon nitride ($SiN_x$), silicon oxide ($SiO_x$) or other electrically insulative material.

The individual wells 120 of the pixel definition layer 116 and the openings for the cathode/bus bar interfaces 136 are formed by an etching process, for example by etching through a patterned mask or a patterned photoresist layer, which is then removed and the substrate cleaned. Then, a sacrificial layer 124 is deposited as a blanket film over at least the active area 102, typically over the entire substrate, to cover the pixel definition layer, and a photoresist layer 126 is formed over the sacrificial layer 124. Openings 122 are formed through the photoresist layer 126, each opening having an opening area in the second direction (X direction) typically larger than that of each individual well 120 formed in the pixel definition layer 116 and in the second direction (X direction) to extend over the location of a bus bar 104. A wet etchant is introduced to isotopically etch away the portion of the sacrificial layer 124 overlying each region where a well 120 is formed, such that the portion of the sacrificial layer 124 overlying each region where a well 120 is formed is removed exposing the surface of the pixel definition layer 116 and the anode 114 exposed at the base of the well 120, and the opening in the sacrificial layer 124 extends under a portion of the photoresist layer 126 at each 120 location, leaving an overhanging portion of the photoresist layer 126 at each well 120 location. The opening 122 extends over the plurality of wells 120 in a row of active areas 102. For example, the boundary of each of the rows 110A-110C in FIG. 1A is the boundary of an opening 122.

After cleaning the substrate, to remove the byproducts of the etching process, the OLED materials is deposited as a continuous layer through the opening 122, and thus onto the portion of the pixel definition layer 116 extending between the wells 120, as well as into the individual wells 120 and also on top of 126. Then a cathode 128 (e.g., a second conductive layer) is deposited as a continuous layer through the opening 122 and over the OLED material 118 in each well 120 and the portion of the pixel definition layer 116 therebetween and is electrically separated (insulated) from the anode 114 by the pixel definition layer 116. The term "continuous" or "continuously" as used herein can be defined as a conformal, uninterrupted layer deposited through a slotted photolithography pattern having a linear slot extending in the second direction as described herein.

A directional deposition method, such as thermal evaporation or sputtering (physical vapor deposition), or a combination of both, to deposit one or multiple conductive materials through the opening 122 allows the overhang of the photoresist layer 126 to limit the lateral extent of the conductive material in the first and second direction. However, with proper sizing of the opening relative to the spread in the directionality of the deposition methodology, the conductive material of the cathode 128 will extend over the entirety of the OLED material 118 in each well, and in some cases beyond the sides thereof, to be deposited directly onto the pixel definition layer immediately adjacent the perimeter of the OLED material 118 in each well 120, to help isolate the OLED material 118. In one embodiment, both of the OLED material and the cathode 128 are deposited by a directional deposition method as described above, However, the cathode 128 does not need to extend over the OLED material 118.

An encapsulation layer 130 is formed continuously over the pixel definition layer 116, the OLED material 118 and the cathode 128. The encapsulation layer 130 prevents moisture from entering the opening 122. The encapsulation layer 130 is SiNx or plasma-polymerized hexamethyldisiloxane (pp-HMDSO) in some embodiments. The sacrificial layer 124 (as well as other layers above the photoresist layer 126) are subsequently removed. The above processes will typically be repeated three times to form a full color display, for rows having sub-pixels 108A, 108B and 108C individually.

In the sectional view of FIG. 1C, the extended length of the cathode 128 provides electrical communication with at least one of the bus bars 104. For example, the bus bar 104 is directly connected to the cathode 128 at a cathode/bus bar interface 136. This direct electrical connection differs from conventional dot type photolithography patterned OLED devices as a separate electrical contact pad, utilized in the conventional devices, is not needed. In conventional devices, a separate step is needed to form an electrical contact pad (e.g., a metal plate, foil or film) to complete the electrical connection between the cathode and the bus bar. However, the device described herein eliminates that additional electrical contact step.

In some embodiments, the OLED materials may overlap and be in direct contact with the surface of the bus bars. If OLED material contacts a bus bar, a laser drilling process is applied before cathode deposition to remove the OLED material from the bus bars for cathode deposition. Thus, the cathode will be in direct contact with the bus bars.

Referring to FIGS. 1B and 1C, the photolithography patterns and processes used to form the display 100 as described herein provide a more robust display and reduce the number of process steps. In addition to eliminating the additional electrical contact pad step described above, the blanket deposited OLED material (separately deposited as red, green and blue stripes in each active area 102) naturally conforms to the shape of the well 120 and is discontinuous exteriorly of a taper region 140 surrounding the well 120.

Figure 2A:
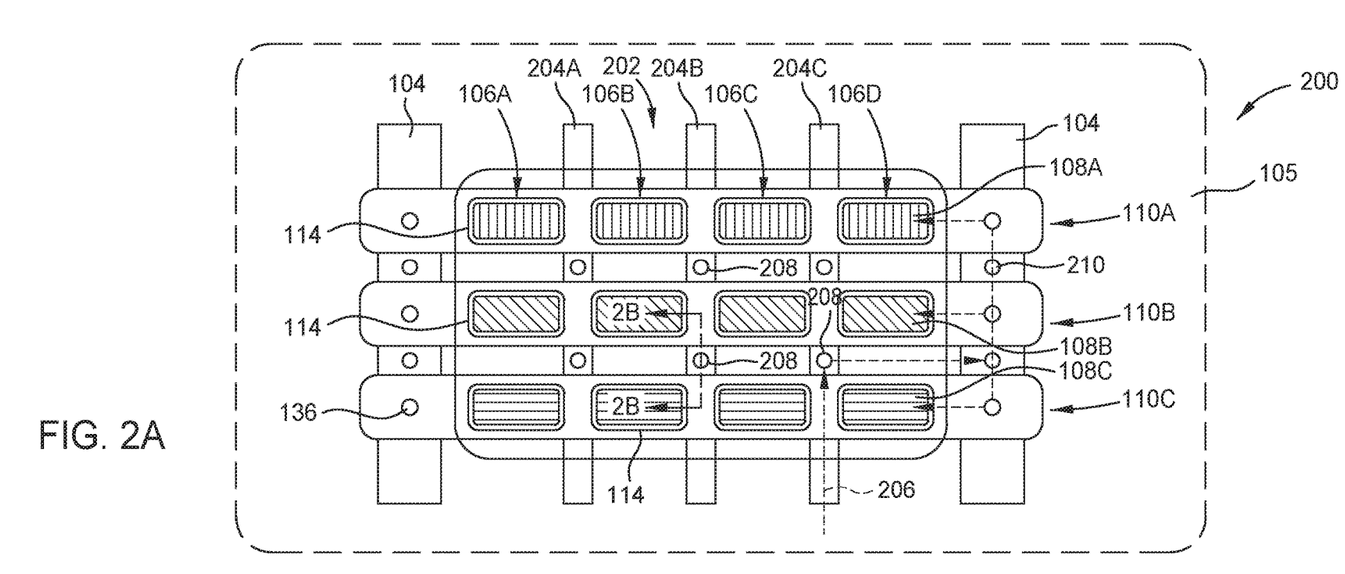
FIG. 2A is a plan view of a pixel sub-area of a display according to another embodiment.
Figure 2B:
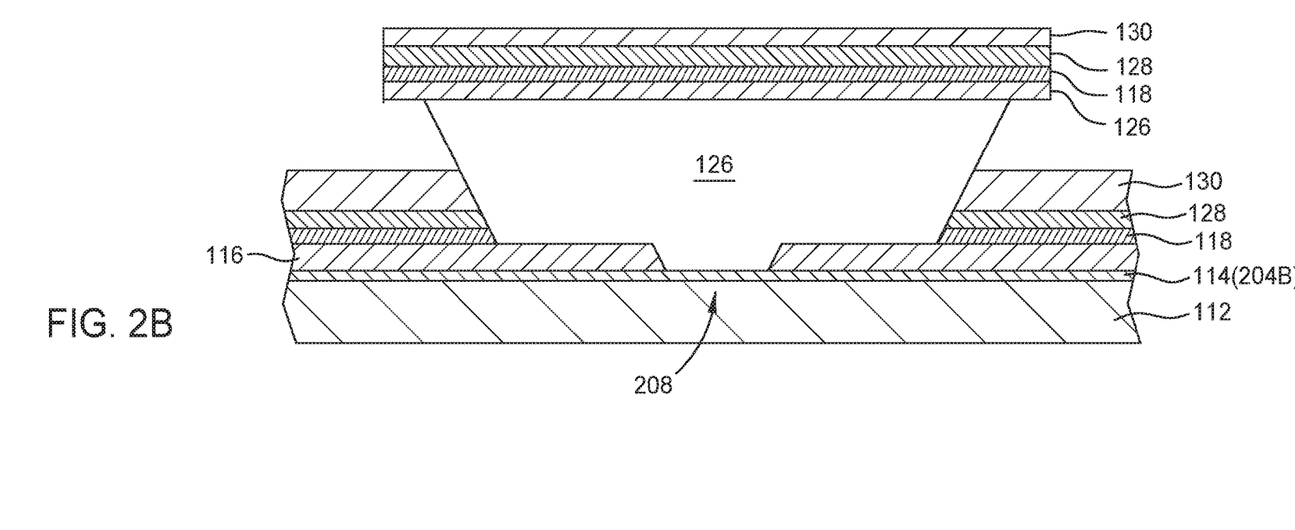
FIGS. 2B and 2C are sectional views of a portion of the display along lines 2B-2B of FIG. 2A in different stages of the formation process.
Figure 2C:
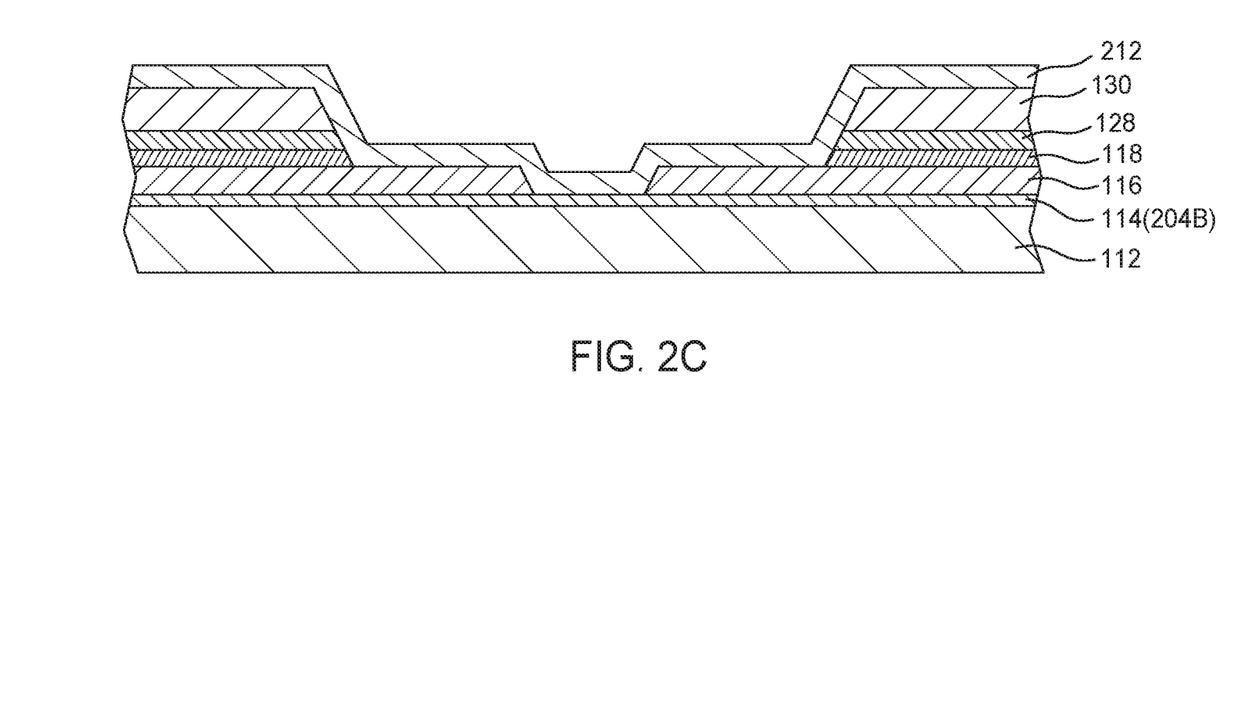

FIGS. 2A-2C are various are various views of a portion of a display 200 according to another embodiment. FIG. 2A is a plan view of an active area 202 of the display 200, and FIGS. 2A and 2C are sectional views of a portion of the active area 202 along lines 2B-2B of FIG. 2A. FIG. 2B shows a portion of the display 200 in a formation process and FIG. 2C shows the portion of the display 200 as a finished product having a transparent conductive layer 212. The transparent conductive layer 212 may be deposited as a blanket layer over the entire active area 202 and two bus bars 104.

The active area 202 is positioned between two bus bars 104 on opposing sides thereof similar to the embodiment shown in FIGS. 1A-1C. Common reference numerals present in FIGS. 2A-2C that are described in FIGS. 1A-1C will not be explained further for brevity.

In this embodiment, additional conductive pathways are added to the display 200 and are shown as a plurality of conductive layers 204 (e.g., a third conductive layer or layers). Each of the plurality of conductive layers 204A-204C are between the bus bars 104. Each of the plurality of conductive layers 204A-204C are spaced apart from each other and spaced apart from the bus bars 104. Each of the plurality of conductive layers 204A-204C is configured to supply current and/or voltage to the individual sub-pixels 108A, the sub-pixels 108B, and the sub-pixels 108C.

An example of current flow through one of the plurality of conductive layers 204A-204C is indicated by dashed-line arrows 206. Input current is provided to one of the conductive layers 204C as shown. The input current signal flows to an electrical contact 208 on the conductive layer 204C and then to a contact 210 on the bus bar 104 via the transparent conductive layer 212. The signal is then distributed along the bus bar 104 and provides current to each of the sub-pixels 108A, the sub-pixels 108B, and the sub-pixels 108C on the pixel column 106D as well as all sub-pixels on columns 106A-106C.

The display 200 includes the transparent conductive layer 212 positioned over the electrical contacts 208 and the contact 210 on the bus bar shown in FIG. 2C. The transparent conductive layer 212 provides electrical connection between electrical contacts 208 and the contact 210 on the bus bar. The transparent conductive layer 212 is deposited after the sacrificial layer 124 and the photoresist layer 126 (both shown in FIGS. 1B and 1C) are removed. The transparent conductive layer 212 may be indium tin oxide (ITO), indium zinc oxide (IZO) or other transparent conductive materials. The transparent conductive layer 212 may be beneficially utilized for top emission displays. The transparent conductive layer 212 is utilized to reduce dynamic voltage (IR) drop in the display 200.

Figure 3A:
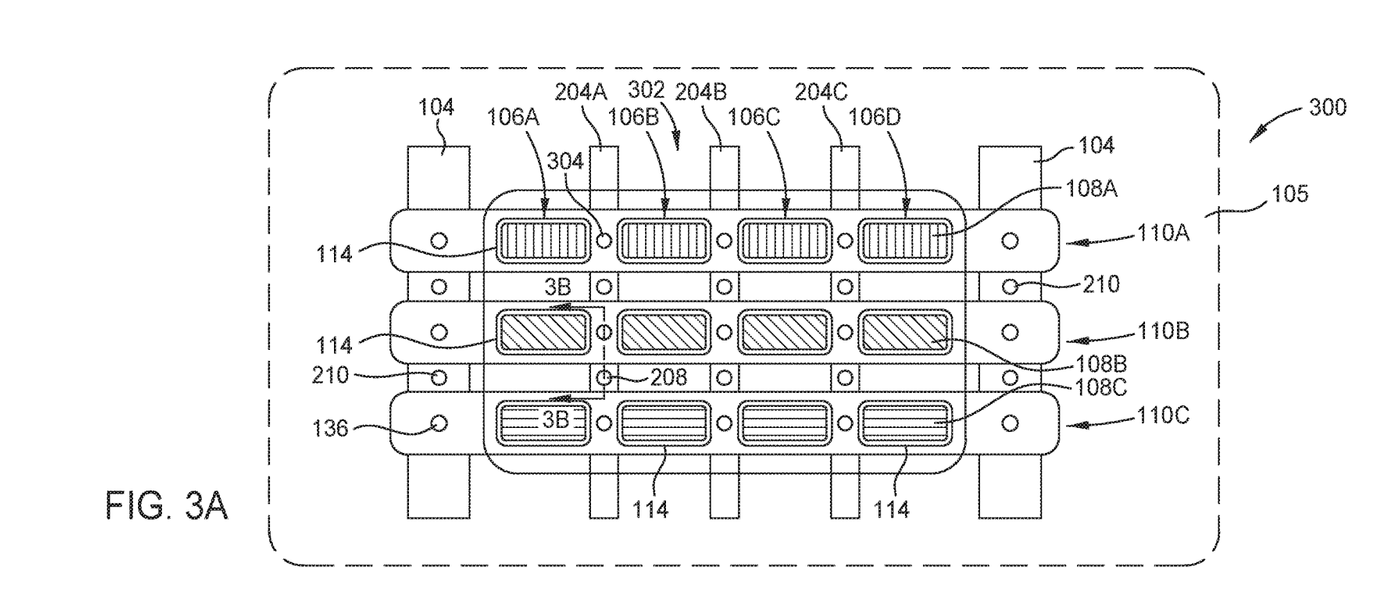
FIG. 3A is a plan view of a pixel sub-area of a display according to another embodiment.
Figure 3B:
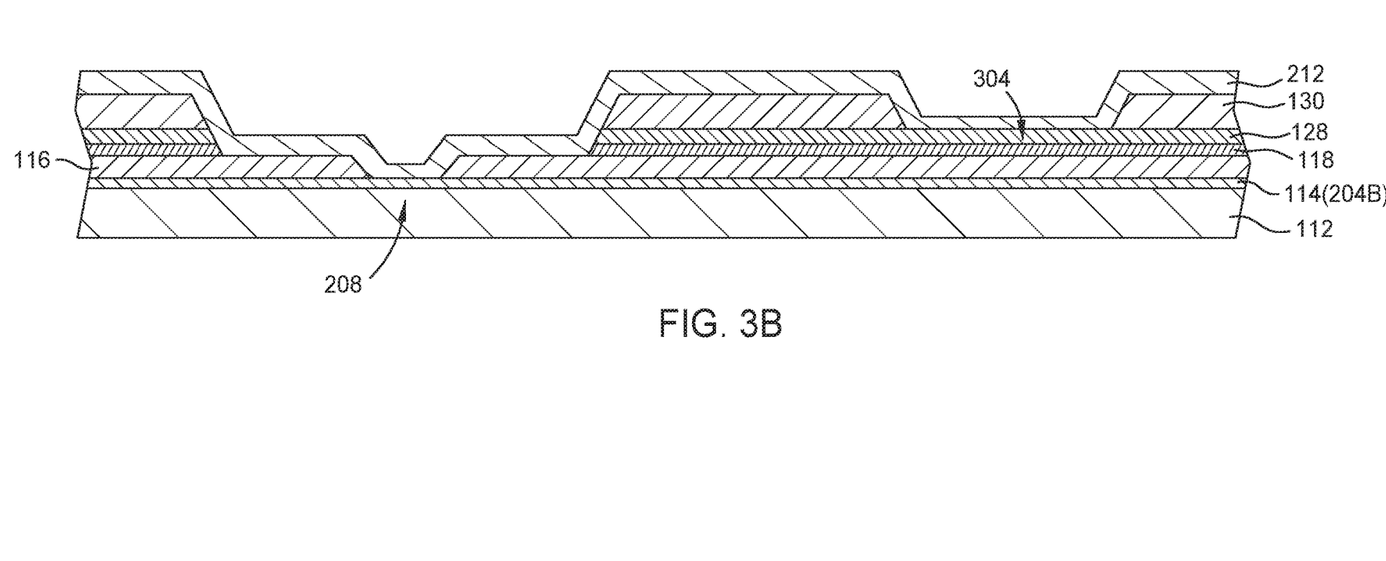
FIG. 3B is a sectional view of the display along lines 3B-3B of FIG. 3A.

FIGS. 3A and 3B are various are various views of a portion of a display 300 according to another embodiment. FIG. 3A is a plan view of an active area 302 of the display 300, and FIG. 3B is a sectional view of a portion of the active area 302 along lines 3B-3B of FIG. 3A. Common reference numerals present in FIGS. 3A and 3B that are described in FIGS. 1A-2B will not be explained further for brevity.

In this embodiment, an additional electrical contact feature is formed on the active area 302 and is shown as a plurality of cathode electrical contacts 304. Each of the plurality of cathode electrical contacts 304 are formed by an additional lithography process that forms a via hole through the encapsulation layer 130 such that the cathode 128 is exposed. Cathode 128 may consist of more than one layer so that upper layer will protect lower layer during via hole forming process. Then, the transparent conductive layer 212 is formed on the display 300. The plurality of cathode electrical contacts 304 further improves cathode voltage (IR) drop in the display 300.

While the foregoing is directed to embodiments of the present disclosure, other and further embodiments of the disclosure may be devised without departing from the basic scope thereof, and the scope thereof is determined by the claims that follow.

The invention claimed is:

1. A method for forming an organic light emitting diode (OLED) display structure, comprising:
    depositing two bus bars on a substrate in a first direction;
    depositing a first conductive layer on the substrate as a plurality of discrete islands in a second direction relative to the first direction;
    depositing a dielectric layer on a portion of the first conductive layer, wherein the dielectric layer includes a well having a portion of the first conductive layer exposed;
    depositing an organic light-emitting material into the well and on the dielectric layer in the second direction and between the two bus bars;
    depositing a second conductive layer on the organic light-emitting material in the second direction and between the two bus bars, wherein the second conductive layer is in direct contact with each of the bus bars on opposing sides thereof; and
    depositing an encapsulating layer on the second conductive layer in the second direction to cover a boundary of the second conductive layer.

2. The method of claim 1, wherein an open mask is used during the depositing the organic light-emitting material such that the organic light emitting material is electrically isolated from the bus bars.

3. The method of claim 1, wherein the each of the first conductive layers are associated with a respective sub-pixel.

4. The method of claim 1, wherein each of the first conductive layers surround a respective well.

5. The method of claim 1, wherein the organic light-emitting material is deposited in the well continuously in the second direction, and the encapsulating layer is deposited on the second conductive layer continuously in the second direction to fully cover the boundary of the second conductive layer.

6. The method of claim 1, further comprising a plurality of third conductive layers formed in the first direction between the two bus bars, wherein the organic light-emitting material in the well comprises a sub-pixel of a plurality of sub-pixels defining a pixel column, and each of the plurality of third conductive layers include one or more first electrical contacts coupled to the second conductive layer and positioned between two pixel columns.

7. The method of claim 6, wherein each of the one or more first electrical contacts are in electrical communication with the two bus bars via a transparent conductive layer.

8. The method of claim 6, wherein the second conductive layer includes one or more second electrical contacts electrically coupled to the third conductive layer and positioned between two sub-pixels of the pixel column.

9. The method of claim 8, wherein a transparent conductive layer is formed over the one or more first and second electrical contacts.

10. An organic light emitting diode substrate, comprising:
    a first conductive layer formed on a substrate in a first direction;
    a dielectric layer provided on a portion of the first conductive layer, wherein the dielectric layer includes a well;
    an organic material in the well and on the dielectric layer in a second direction relative to the first direction and between two bus bars and in contact with the first conductive layer;
    overhang structures comprising a second layer disposed on a first layer, the overhang structures having an overhang defined by the second layer with a second sidewall extending past a first sidewall of the first layer;
    a second conductive layer provided on the organic material in the second direction and between the two bus bars, wherein the second conductive layer is in direct contact with each of the bus bars on opposing sides thereof; and
    an encapsulating layer on the second conductive layer in the second direction to cover the second conductive layer.

11. The organic light emitting diode substrate of claim 10, wherein the second direction is substantially orthogonal to the first direction.

12. The organic light emitting diode substrate of claim 10, wherein the first conductive layer comprise a plurality of discrete conductive islands each associated with a respective well.

13. The organic light emitting diode substrate of claim 10, wherein:
    the organic light-emitting material is provided in the well continuously in the second direction,
    the second conductive layer is provided on the organic material continuously in the second direction, and
    the encapsulating layer is provided on the second conductive layer continuously in the second direction to fully cover the second conductive layer.

14. The organic light emitting diode substrate of claim 10, further comprising a plurality of third conductive layers formed in the first direction between the two bus bars, wherein the organic material in the well comprises a sub-pixel of a plurality of sub-pixels defining a pixel column, and each of the plurality of third conductive layers include one or more first electrical contacts coupled to the second conductive layer and positioned between two pixel columns.

15. An organic light emitting diode substrate, comprising:
    a first conductive layer formed on a substrate in a first direction;
    a dielectric layer provided on a portion of the first conductive layer, wherein the dielectric layer includes a well;
    an organic material in the well and on the dielectric layer in a second direction relative to the first direction and between two bus bars and in contact with the first conductive layer;
    a second conductive layer provided on the organic material in the second direction and between the two bus bars, wherein the second conductive layer is in direct contact with each of the bus bars on opposing sides thereof;
    a plurality of third conductive layers formed in the first direction between the two bus bars, wherein the organic material in the well comprises a sub-pixel of a plurality of sub-pixels defining a pixel column, and each of the plurality of third conductive layers includes one or more first electrical contacts coupled to the second conductive layer and positioned between two pixel columns, wherein the second conductive layer includes one or more second electrical contacts coupled to the third conductive layer and positioned between two sub-pixels of the pixel column; and an encapsulating layer on the second conductive layer in the second direction to cover the second conductive layer.

16. The organic light emitting diode substrate of claim 15, wherein a transparent conductive layer is formed over the one or more first and second electrical contacts.

17. The organic light emitting diode substrate of claim 10, wherein the encapsulation layer is disposed adjacent to the second sidewall and over an upper surface of the second layer.

18. The organic light emitting diode substrate of claim 10, wherein the organic material and the second conductive material are disposed adjacent to the second sidewall and over an upper surface of the second layer.

19. An organic light emitting diode substrate, comprising:
an anode layer formed on a substrate in a first direction;
a dielectric layer provided on a portion of the anode layer, wherein the dielectric layer includes a well with portion of anode layer exposed;
an organic material in the well and in contact with the anode layer and on the dielectric layer in a second direction orthogonal to the first direction;
a cathode layer provided on the organic material in the second direction and between two bus bars, wherein the cathode layer is in direct contact with the bus bars at a cathode/bus bar interface on opposing sides thereof, wherein a width of the cathode in the first direction is substantially equal to a width of the organic material in the first direction; and
an encapsulating layer provided on the cathode layer in the second direction to cover the cathode layer.

* * * * *